(12) United States Patent
Lee et al.

(10) Patent No.: US 7,830,017 B2
(45) Date of Patent: Nov. 9, 2010

(54) WAFER LEVEL CHIP SCALE PACKAGE, METHOD OF MANUFACTURING THE SAME, AND SEMICONDUCTOR CHIP MODULE INCLUDING THE WAFER LEVEL CHIP SCALE PACKAGE

(75) Inventors: In-Young Lee, Gyeonggi-do (KR); Dong-Ho Lee, Gyeonggi-do (KR); Nam-Seog Kim, Gyeonggi-do (KR); Hyun-Soo Chung, Gyeonggi-do (KR); Ho-Jin Lee, Seoul (KR); Myeong-Soo Park, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 449 days.

(21) Appl. No.: 11/950,251

(22) Filed: Dec. 4, 2007

(65) Prior Publication Data
US 2008/0128905 A1    Jun. 5, 2008

(30) Foreign Application Priority Data
Dec. 5, 2006    (KR) ............... 10-2006-0122587

(51) Int. Cl.
*H01L 23/48* (2006.01)
*H01L 23/52* (2006.01)
(52) U.S. Cl. ............ 257/773; 257/786; 257/E23.02; 257/778
(58) Field of Classification Search ............ 257/773, 257/786, 778, 23.02 E
See application file for complete search history.

(56) References Cited
U.S. PATENT DOCUMENTS
6,967,399 B2*  11/2005  Aiba et al. ............... 257/693
7,312,143 B2*  12/2007  Park et al. ............... 438/613
7,466,031 B2*  12/2008  Huang ....................... 257/781
2003/0222353 A1*  12/2003  Yamada ................... 257/774

(Continued)

FOREIGN PATENT DOCUMENTS

JP    11-046054    2/1999

(Continued)

OTHER PUBLICATIONS

English language abstract of Japanese Publication No. 11-046054.

(Continued)

*Primary Examiner*—Nitin Parekh
(74) *Attorney, Agent, or Firm*—Muir Patent Consulting, PLLC

(57) ABSTRACT

Provided are a wafer level chip scale package in which a redistribution process is applied at a wafer level, a manufacturing method thereof, and a semiconductor chip module including the wafer level chip scale package. The wafer level chip scale package includes a semiconductor chip having a bonding pad, a first insulating layer disposed on the semiconductor chip so as to expose the bonding pad, a redistribution line disposed on the exposed bonding pad and the first insulating layer, a sacrificial layer disposed below a redistribution pad of the redistribution line, a second insulating layer disposed on the redistribution line so as to expose the redistribution pad and including a crack inducement hole disposed beside the sacrificial layer, and an external connection terminal attached to the redistribution pad.

13 Claims, 11 Drawing Sheets

U.S. PATENT DOCUMENTS

| | | | |
|---|---|---|---|
| 2005/0046038 A1* | 3/2005 | Farnworth et al. | 257/777 |
| 2006/0270108 A1* | 11/2006 | Farnworth et al. | 438/106 |
| 2007/0069347 A1* | 3/2007 | Lin et al. | 257/673 |
| 2007/0235878 A1* | 10/2007 | Lin et al. | 257/773 |

FOREIGN PATENT DOCUMENTS

| | | |
|---|---|---|
| KR | 2001-0061782 | 7/2001 |
| KR | 10-0596452 | 6/2006 |

OTHER PUBLICATIONS

English language abstract of Korean Publication No. 2001-0061782.

English language abstract of Korean Publication No. 10-0596452.

* cited by examiner

WAFER LEVEL CHIP SCALE PACKAGE, METHOD OF MANUFACTURING THE SAME, AND SEMICONDUCTOR CHIP MODULE INCLUDING THE WAFER LEVEL CHIP SCALE PACKAGE

CROSS-REFERENCE TO RELATED PATENT APPLICATIONS

This application claims priority under 35 USC §119 to Korean Patent Application No. 10-2006-0122587, filed on Dec. 5, 2006 in the Korean Intellectual Property Office, the contents of which are incorporated herein in their entirety by reference.

BACKGROUND

1. Technical Field

The present invention relates to a wafer level chip scale package in which a redistribution process is applied at a wafer level, a manufacturing method thereof, and a semiconductor chip module including the wafer level chip scale package. More particularly, the present invention relates to a wafer level chip scale package having a sacrificial layer capable of inducing a crack which otherwise may be generated in a solder joint, a manufacturing method thereof, and a semiconductor chip module including the wafer level chip scale package.

2. Description of the Related Art

In order to meet consumer demand, electronic products are becoming smaller, lighter, and faster while their capacities are increasing. As demand for miniaturization of the electronics products increases, a semiconductor chip package is becoming smaller and lighter. The small semiconductor chip package may be, for example, a wafer level chip scale package or a wafer level package. The wafer level chip scale package is a package in which a semiconductor chip is not separated from a wafer prior to packaging during a manufacturing process.

FIG. 1 is a sectional view of a wafer level chip scale package 100 according to a conventional technology. Referring to FIG. 1, the wafer level chip scale package 100 includes a wafer having a semiconductor chip 105, an aluminum pad 110, a passivation layer 115, a first insulating layer 120, a redistribution line or rerouting line metal layer 125, a second insulating layer 130, and a solder ball 135 that is an external connection terminal.

In the manufacturing process of the wafer level chip scale package 100, the first insulating layer 120, which may be an interlayer dielectric material, is applied over a wafer. The aluminum pad 110, which is a bonding pad, is exposed using a photolithography process, including a film exposure process and a development process. The redistribution line metal layer 125 is formed on the first insulating layer 120 and the aluminum pad 110 through a sputtering process. Photoresist is coated on the redistribution line metal layer 125. A portion of the redistribution line metal layer 125, excluding a redistribution line or retribution pattern and a redistribution pad, is removed through the photolithography process. The redistribution pad is a part of the redistribution line where the solder ball 135 is attached and is referred to as a ball land. After the second insulating layer 130, that is the interlayer dielectric material, is applied, the redistribution pad is exposed using a photolithography process. Then, the solder ball 135 is attached on the redistribution pad through a solder ball attachment process, thereby completing the wafer level chip scale package 100.

The wafer level chip scale package 100 is mounted on a module substrate or a module PCB (printed circuit board) to form a semiconductor chip module. When a temperature cycle test is performed on the semiconductor chip module, a crack can be generated in the solder joint that is a connecting portion between the solder ball 135 and the redistribution pad. FIG. 2 is an SEM (scanning electron microscope) image showing the crack generated in the solder joint of the wafer level chip scale package 100.

The crack can be generated due to thermal stress and can be attributable to a difference in the coefficient of thermal expansion (CTE) between the semiconductor chip 105 and the module substrate. As the reliability of the solder joint is deteriorated by the crack, the reliability of the semiconductor chip module can be decreased. Thus, a wafer level chip scale package which can minimize defects of a semiconductor chip module due to the solder joint crack is needed.

SUMMARY

To solve the above and/or other problems in the conventional art, the present invention provides a wafer level chip scale package which can minimize or reduce defects of a semiconductor chip module due to a solder joint crack, a manufacturing method thereof, and a semiconductor chip module including the wafer level chip scale package.

In one embodiment, a wafer level chip scale package comprises a semiconductor chip including a bonding pad, a first insulating layer disposed on the semiconductor chip so as to expose the bonding pad, a redistribution line disposed on the exposed bonding pad and the first insulating layer, a sacrificial layer disposed below a redistribution pad of the redistribution line, a second insulating layer disposed on the redistribution line so as to expose the redistribution pad and including a crack inducement hole disposed beside the sacrificial layer, and an external connection terminal attached to the redistribution pad.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION

Figure 1:
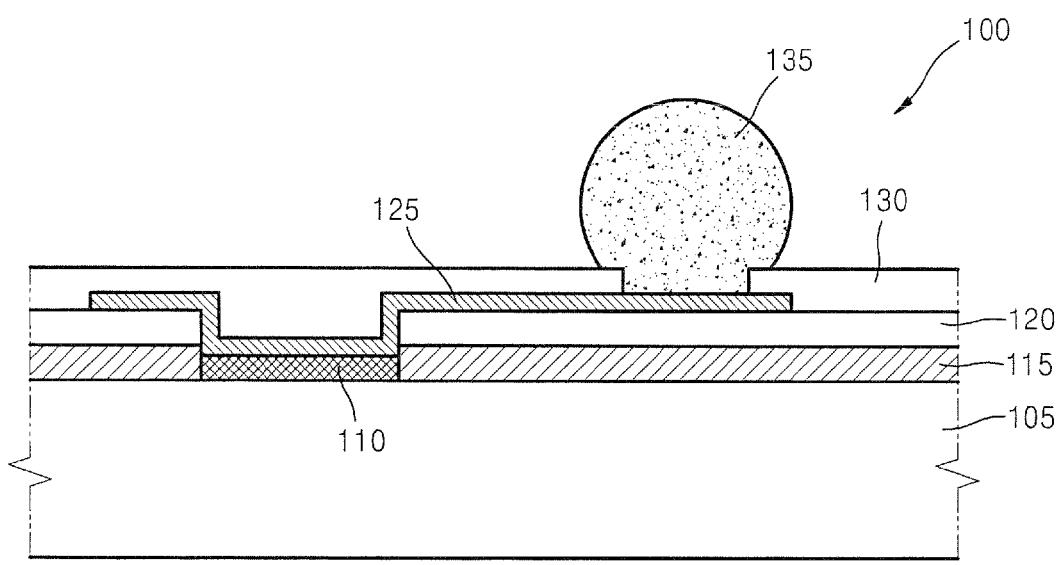
FIG. 1 is a cross-sectional view of a conventional wafer level chip scale package.
Figure 2:
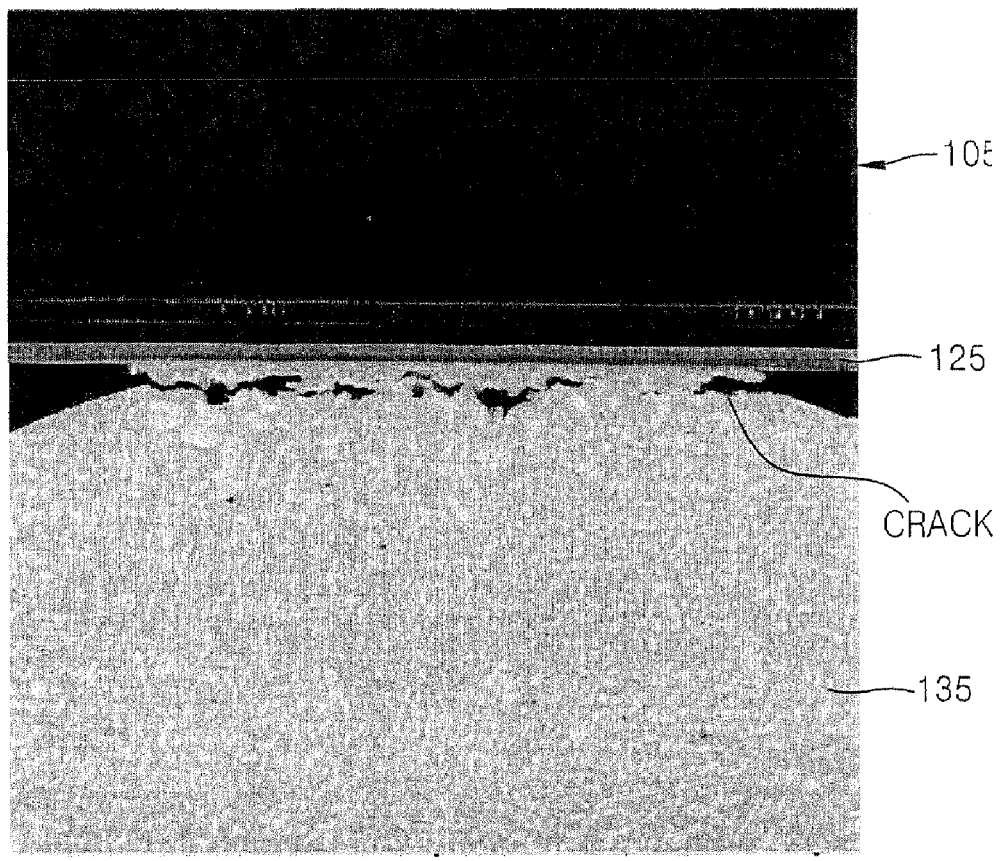
FIG. 2 is an SEM (scanning electron microscope) image showing a crack generated in the solder joint of the wafer level chip scale package of FIG. 1.

The attached drawings illustrate preferred embodiments of the present invention and are referred to below in order to gain a sufficient understanding of the present invention, the merits thereof, and the objectives accomplished by the implementation of the present invention.

Hereinafter, the present invention will be described in detail by explaining preferred embodiments of the invention with reference to the attached drawings. Like reference numerals in the drawings denote like elements.

Figure 3:
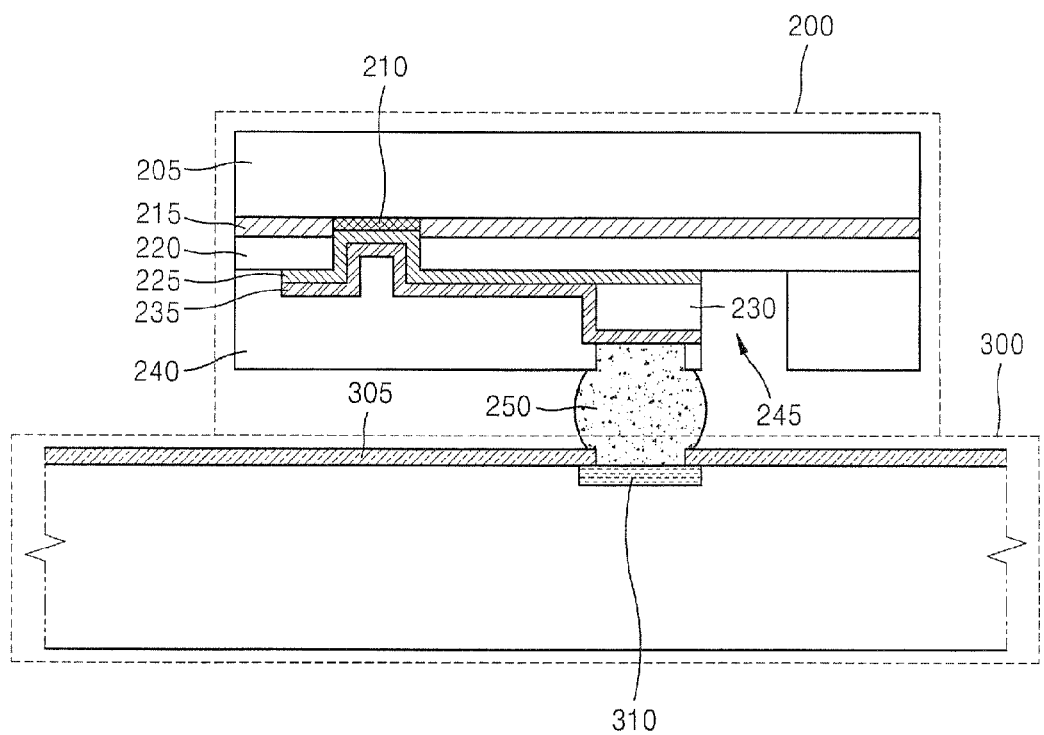
FIG. 3 is a cross-sectional view of a semiconductor chip module including a wafer level chip scale package according to an embodiment of the present invention.

FIG. 3 is a sectional view of a semiconductor chip module including a wafer level chip scale package according to an embodiment of the present invention. Referring to FIG. 3, a semiconductor chip module according to the present embodiment includes a wafer level chip scale package 200 and a module substrate 300. The semiconductor chip module may be, for example, a semiconductor memory chip module. The wafer level chip scale package 200 is electrically and mechanically connected to the module substrate 300 via an external connectional terminal such as a solder ball 250.

The wafer level chip scale package 200 includes a semiconductor chip or a semiconductor circuit device 205, a bonding pad or electrode pad 210, a passivation layer 215, a first insulating layer 220, which may be an interlayer dielectric material, a first metal layer 225, a sacrificial layer 230, a second metal layer 235, a second insulating layer 240, which may also be an interlayer dielectric material, a crack inducement hole 245, and the solder ball 250. The semiconductor chip 205 may be a single chip separated from a wafer or it may be a semiconductor chip that is not separated from the wafer. The wafer may include the semiconductor chip 205, the bonding pad 210, and the passivation layer 215 before the semiconductor chip 205 is separated from the wafer.

The passivation layer 215 and the first insulating layer 220 are formed on the semiconductor chip 205 such that the bonding pad 210 is exposed or open. The bonding pad 210 can be formed of, for example, an aluminum layer, and the passivation layer 215 may be a silicon nitride (SiN) film. The first insulating layer 220 is a polymer layer and may include polyimide.

The first metal layer 225 is partially formed on the exposed bonding pad 210 and the first insulating layer 220. The first metal layer 225 is a seed metal layer and may be, for example, a Ti/Cu layer.

The sacrificial layer 230 is partially formed on the exposed first metal layer 225. The sacrificial layer 230 can be formed between the first metal layer 225 and the second metal layer 235, which form a redistribution line or redistribution pattern, or under a redistribution pad that is a part of the second metal layer 235. The sacrificial layer 230 may include solder. A crack which otherwise would be generated in the solder joint is instead induced in the sacrificial layer 230 during a temperature cycle test. That is, when the temperature cycle test is performed, a crack is generated in the sacrificial layer 230, not in the solder joint, so that defects of the semiconductor chip module due to the crack can be minimized or reduced.

The second metal layer 235, which is a main metal layer, is formed on the exposed first metal layer 225 and the sacrificial layer 230. The second metal layer 235 may be, for example, a Ti/Cu layer. The redistribution line formed of the first metal layer 225 and the second metal layer 235 includes the redistribution pad or ball land, which is a part of the redistribution line where the solder ball 250 is attached. The first and second metal layers 225 and 235 may comprise conductive materials other than metal and may be referred to as first and second conductive layers.

The second insulating layer 240 is formed on the exposed first insulating layer 220 and the second metal layer 235 such that the crack inducement hole 245 and the redistribution pad of the second metal layer 235, where the solder ball 250 is attached, are exposed. The second insulating layer 240 and the sacrificial layer 230 define the crack inducement hole 245 formed beside the sacrificial layer 230. The second insulating layer 240 may include polyimide, similar to the first insulating layer 220.

The solder ball 250 is attached on the redistribution pad that is the exposed portion of the second insulating layer 240. Although in the present embodiment the external connection terminal is the solder ball 250, the external connection terminal may be a metal bump such as cupper (Cu), gold (Au), or nickel (Ni), or any other type of external connection terminal as is known in the art.

The crack inducement hole 245, as shown in FIG. 3, is formed in the second insulating layer 240 beside the first metal layer 225, the sacrificial layer 230, the second metal layer 235, and the second insulating layer 240 which are formed on and above the first insulating layer 220. When observed in plan view (i.e. from a direction normal to the surface of the second insulating layer 240), the crack inducement hole 245 may have, for example, a polygonal shape substantially surrounding a partial surface of the solder ball 250. The crack inducement hole 245 can easily induce the generation of a crack in the sacrificial layer 230, which may otherwise have been generated in the solder joint. Thus, the crack inducement hole 245 and the sacrificial layer 230 form a crack inducement structure.

The module substrate 300 includes a photo solder resist layer 305 and a mounting pad or substrate pad 310. The photo solder resist layer 305, which is an insulating protection layer, is formed such that the mounting pad 310 formed on a base substrate is exposed. The mounting pad 310 is connected to wiring of the module substrate 300.

Figure 4:
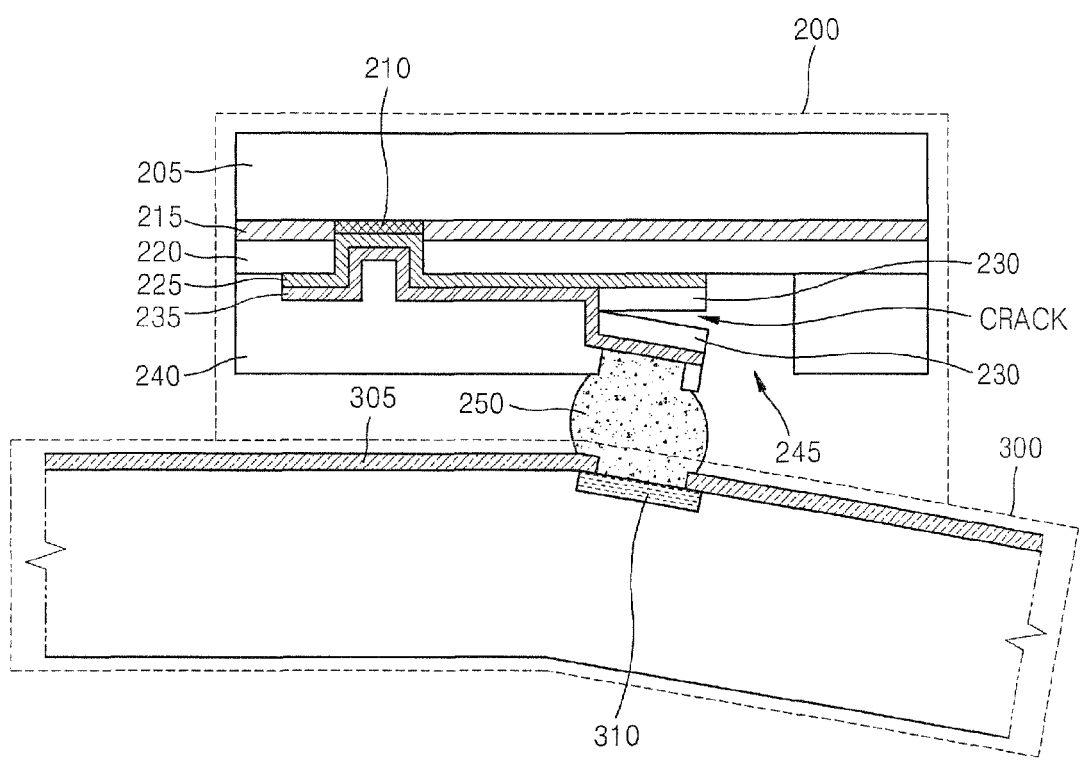
FIG. 4 is a cross-sectional view of the semiconductor chip module of FIG. 3 when thermal stress is generated in the semiconductor chip module of FIG. 3.

FIG. 4 is a cross-sectional view of the semiconductor chip module of FIG. 3 when thermal stress is generated in the semiconductor chip module of FIG. 3. That is, FIG. 4 is a cross-sectional view for explaining the wafer level chip scale package 200 of FIG. 3, which induces a crack in the sacrificial layer 230 that may otherwise have been generated in the solder joint.

Referring to FIG. 4, the crack that may have been generated in the solder joint in the temperature cycle test is instead induced in the sacrificial layer 230 of the wafer level chip scale package 200. Since the sacrificial layer 230 is separated into two parts and moved up and down by the crack, the thermal stress is not concentrated at a particular point. Thus, the crack is not further propagated.

Therefore, when the wafer level chip scale package 200 according to the present embodiment is mounted on the module substrate 300 to form a semiconductor chip module, since the wafer level chip scale package 200 can induce the crack that may otherwise have been generated in the solder joint to the sacrificial layer 230, the wafer level chip scale package 200 can skip an underfill process. The underfill process is typically needed for improvement of reliability, that is, to prevent cracks in the solder joint, when a semiconductor chip module is manufactured or fabricated. Also, since the wafer level chip scale package 200 can prevent cracks that are generated in the solder joint, the reliability of mounting of a semiconductor chip module can be improved.

Figure 5:
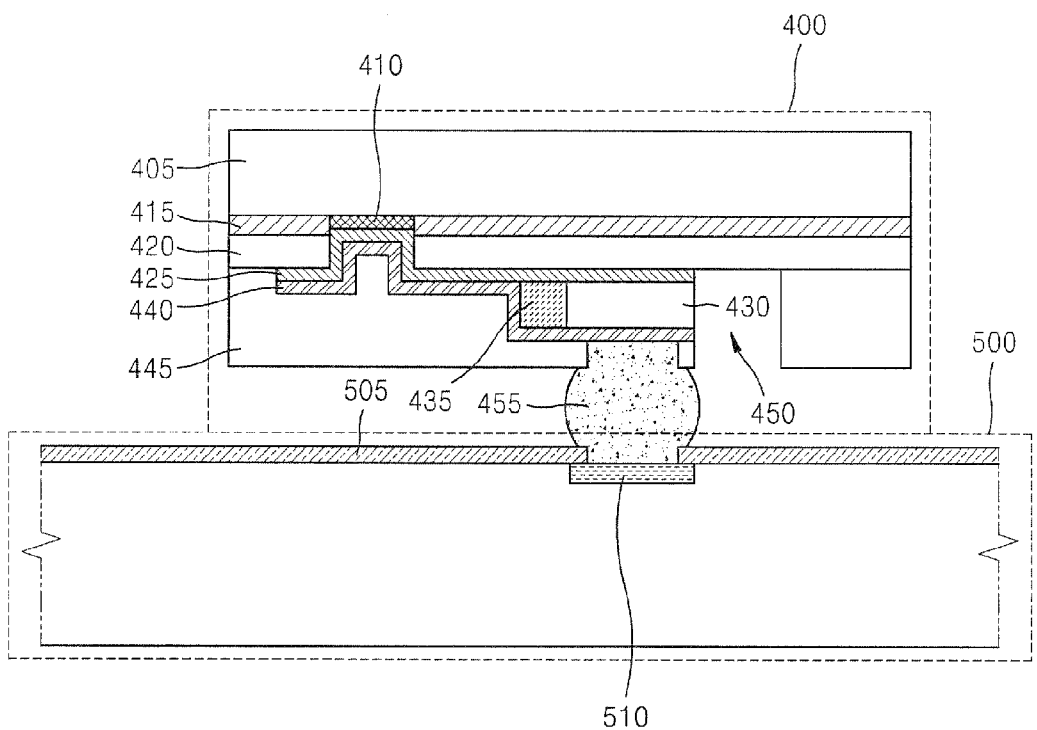
FIG. 5 is a cross-sectional view of a semiconductor chip module including a wafer level chip scale package according to another embodiment of the present invention.

FIG. 5 is a cross-sectional view of a semiconductor chip module including a wafer level chip scale package according to another embodiment of the present invention. Referring to FIG. 5, a semiconductor chip module according to the present embodiment includes a wafer level chip scale package 400 and a module substrate 500. The semiconductor chip module may be, for example, a semiconductor memory chip module. The wafer level chip scale package 400 is electrically and mechanically connected to the module substrate 500 via a solder ball 455.

The wafer level chip scale package 400 includes a semiconductor chip 405, a bonding pad 410, a passivation layer 415, a first insulating layer 420, which is an interlayer dielectric material, a first metal layer 425, a sacrificial layer 430, a crack buffer 435, a second metal layer 440, a second insulating layer 445, which is also an interlayer dielectric material, a crack inducement hole 450, and the solder ball 455, which is an external connection terminal. The semiconductor chip 405 may be a single chip separated from a wafer or it may be a semiconductor chip which is not separate from the wafer. The wafer may include the semiconductor chip 405, the bonding pad 410, and the passivation layer 415 prior to separating the semiconductor chip 405 from the wafer.

The passivation layer 415 and the first insulating layer 420 are formed on the semiconductor chip 405 where the bonding pad 410 is formed such that the bonding pad 410 is exposed. The bonding pad 410 can be formed of, for example, an aluminum layer, and the passivation layer 415 may be a silicon nitride (SiN) film. The first insulating layer 420 is a polymer layer and may include polyimide.

The first metal layer 425 is partially formed on the exposed bonding pad 410 and the first insulating layer 420. The first metal layer 425 is a seed metal layer and may be, for example, a Ti/Cu layer.

The sacrificial layer 430 is partially formed on the exposed first metal layer 425. The sacrificial layer 430 can be formed between the first metal layer 425 and the second metal layer 440, which form a redistribution line or redistribution pattern, or under a redistribution pad that is a part of the second metal layer 440. The sacrificial layer 430 may include solder. A crack, which otherwise may be generated in the solder joint, is instead induced in the sacrificial layer 430 during a temperature cycle test. That is, when the temperature cycle test is performed, a crack is generated in the sacrificial layer 430, not in the solder joint, so that defects of the semiconductor chip module due to the crack can be minimized or reduced.

The crack buffer 435 is formed between the sacrificial layer 430 and the redistribution line. The crack buffer 435 may include a polymer. In other embodiments of the present invention, an air gap can be used as the crack buffer 435. The crack buffer 435 stops the further propagation of cracks in the sacrificial layer 430 induced by stresses. Thus, the crack buffer 435 can reduce the effect on the second metal layer 440 from the crack, for example, the disconnection of the second metal layer 440.

The second metal layer 440, that is a main metal layer, is formed on the exposed first metal layer 425 and the sacrificial layer 430. The second metal layer 440 may be, for example, a Ti/Cu layer. The redistribution line formed of the first metal layer 425 and the second metal layer 440 includes the redistribution pad or ball land, which is a part of the redistribution line where the solder ball 455 is attached.

The second insulating layer 445 is formed on the exposed first insulating layer 420 and the second metal layer 440 such that the crack inducement hole 450 and the redistribution pad of the second metal layer 440 where the solder ball 455 is attached are exposed. The second insulating layer 445 includes the crack inducement hole 450 formed beside the sacrificial layer 430. The second insulating layer 445 may include polyimide, similar to the first insulating layer 420.

The solder ball 455 is attached on the redistribution pad that is the exposed portion of the second insulating layer 445. Although in the present embodiment the external connection terminal is the solder ball 455, the external connection terminal may be a metal bump such as cupper (Cu), gold (Au), or nickel (Ni) or any other type of external connection terminal, as is known in the art.

The crack inducement hole 450, as shown in FIG. 5, is formed in the second insulating layer 445 beside the first metal layer 425, the sacrificial layer 430, the second metal layer 440, and the second insulating layer 445, which are formed on and above the first insulating layer 420. When observed in plan view (i.e. from a direction normal to the surface of the second insulating layer 445), the crack inducement hole 450 may have, for example, a polygonal shape substantially surrounding a partial surface of the solder ball 455. The crack inducement hole 450, as described above with reference to FIG. 4, can easily induce the generation of cracks in the sacrificial layer 430 which may otherwise have been generated in the solder joint. Thus, the crack inducement hole 450 and the sacrificial layer 430 form a crack inducement structure.

The module substrate 500 includes a photo solder resist layer 505 and a mounting pad 510. The photo solder resist layer 505, which is an insulating protection layer, is formed such that the mounting pad 510 formed on a base substrate is exposed. The mounting pad 510 is connected to wiring of the module substrate 500.

Figure 6A:
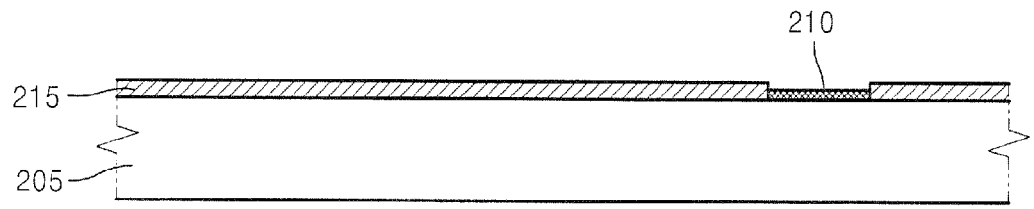
FIGS. 6A through 6G are cross-sectional views illustrating a method of manufacturing the wafer level chip scale package of FIG. 3.

FIGS. 6A through 6G are cross-sectional views illustrating a method of manufacturing the wafer level chip scale package 200 of FIG. 3. Referring to FIG. 6A, the passivation layer 215 is formed on the semiconductor chip 205 including the bonding pad 210. The passivation layer 215 is partially etched to expose the surface of the bonding pad 210. The semiconductor chip may be a single chip separated from a wafer.

Figure 6B:
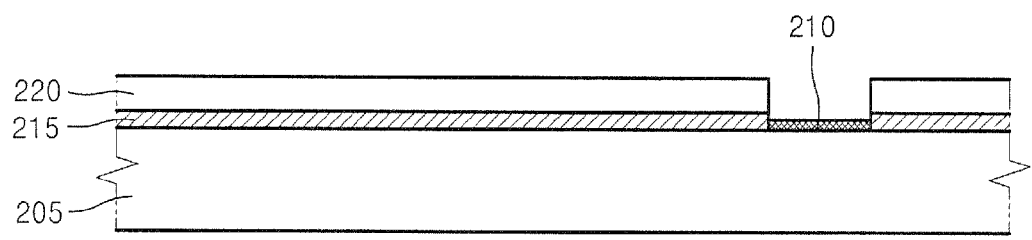

Referring to FIG. 6B, the first insulating layer 220 is formed on the passivation layer 215. The first insulating layer 220 is exposed through a photo mask to open the bonding pad 210. The exposed first insulating layer 210 is removed using a developing solution. The first insulating layer 220, for example, can be formed in a spin coating method.

Figure 6C:
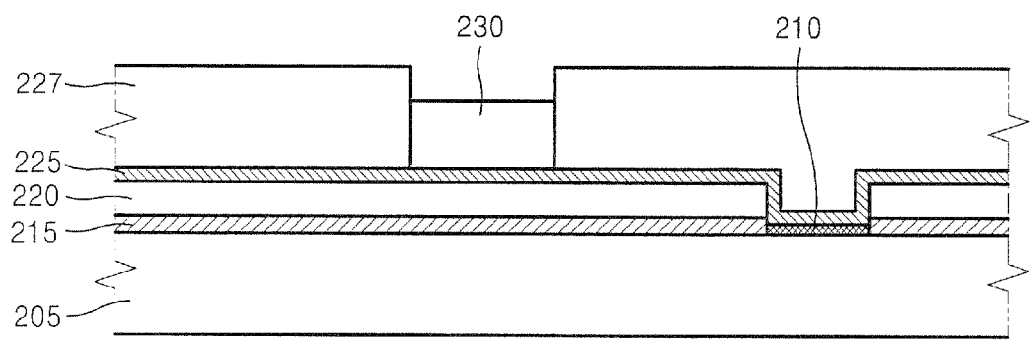

Referring to FIG. 6C, the first metal layer 225 is formed on the open bonding pad 210 and the first insulating layer 220. The first metal layer 225 can be formed in a sputtering process. After the photoresist pattern 227 is formed on the first metal layer 225 using a photolithography process, the sacrificial layer 230 is formed using the photoresist pattern 227.

Figure 6D:
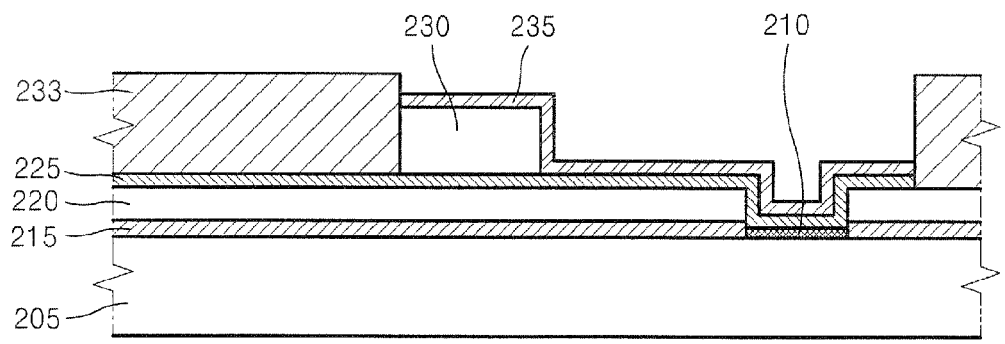

Referring to FIG. 6D, to define the redistribution line that is the second metal layer 235 on the first metal layer 225, the photoresist pattern 233 is formed on the first metal layer 225. The second metal layer 235 is selectively formed on the exposed first metal layer 225 and the sacrificial layer 230. The second metal layer 235 can be formed in a plating process.

Figure 6E:
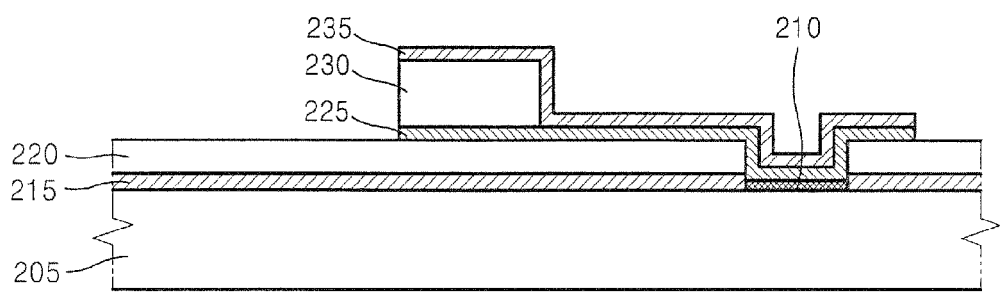

Referring to FIG. 6E, after the photoresist pattern 233 is removed, the first metal layer 225 is etched in an etching process using the second metal layer 235 and the sacrificial layer 220 as a mask. As a result, the redistribution line or redistribution pattern including the first and second metal layers 225 and 235 is formed.

Figure 6F:
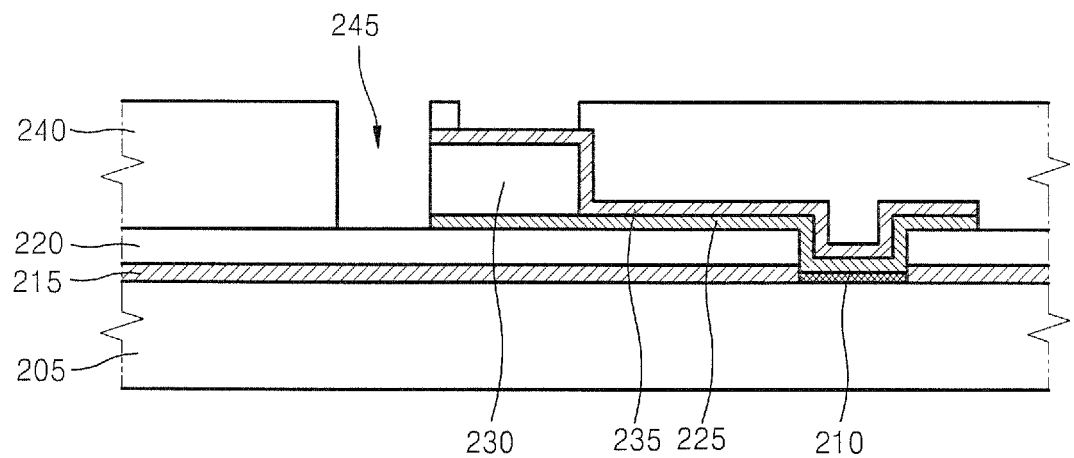

Referring to FIG. 6F, the second insulating layer 240 is formed on the second metal layer 225 and the first insulating layer 220. Then, the second insulating layer 240 is partially etched such that the crack inducement hole 245 is defined beside a portion formed of the first metal layer 225, the sacrificial layer 230, and the second metal layer 235. Also, the second insulating layer 240 is partially removed such that the redistribution pad of the redistribution line located on the sacrificial layer 230 is open.

Figure 6G:
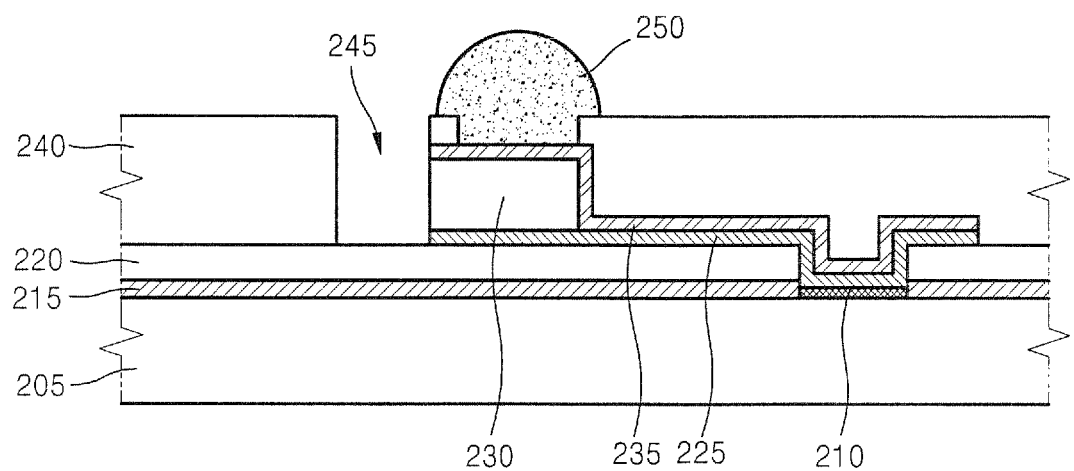

Referring to FIG. 6G, the solder ball 250 is attached to the redistribution pad in the solder ball attachment process, thereby completing the wafer level chip scale package 200 of FIG. 3.

Figure 7A:
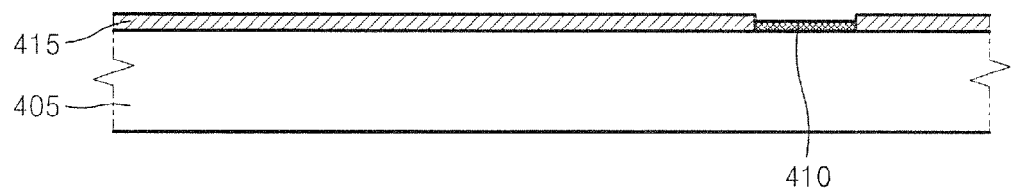
FIGS. 7A through 7H are cross-sectional views illustrating a method of manufacturing the wafer level chip scale package of FIG. 5.

FIGS. 7A through 7H are cross-sectional views illustrating a method of manufacturing the wafer level chip scale package 400 of FIG. 5. Referring to FIG. 7A, the passivation layer 415 is formed on the semiconductor chip 405 including the bonding pad 410. The passivation layer 415 is partially etched to expose the surface of the bonding pad 410. The semiconductor chip 405 may be a single chip separated from a wafer or it may be processed in wafer form.

Figure 7B:
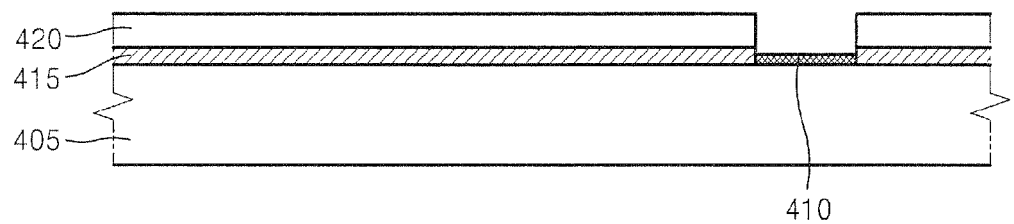

Referring to FIG. 7B, the first insulating layer 420 is formed on the passivation layer 415. The first insulating layer 420 is exposed through a photo mask to open the bonding pad 410. The exposed first insulating layer 410 is removed using a developing solution. The first insulating layer 420, for example, can be formed in a spin coating method.

Figure 7C:
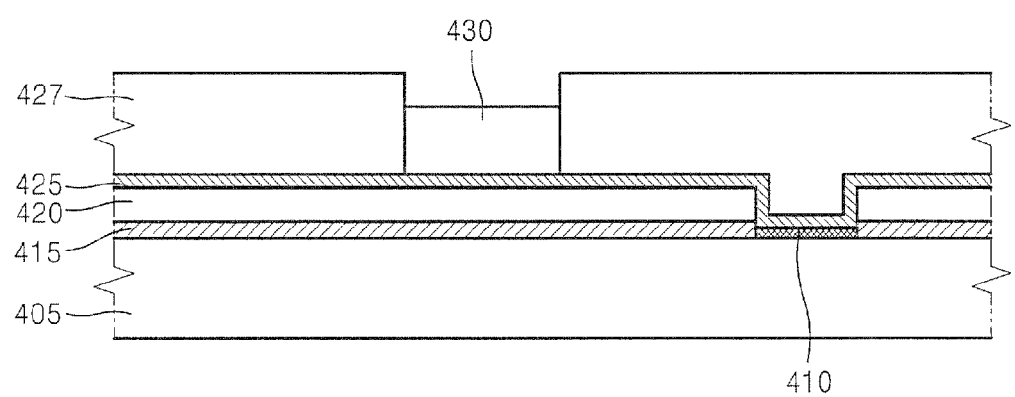

Referring to FIG. 7C, the first metal layer 425 is formed on the open bonding pad 410 and first insulating layer 420. The first metal layer 425 can be formed in a sputtering process. After the photoresist pattern 427 is formed on the first metal layer 425 in the photolithography process, the sacrificial layer 430 is formed using the photoresist pattern 427.

Figure 7D:
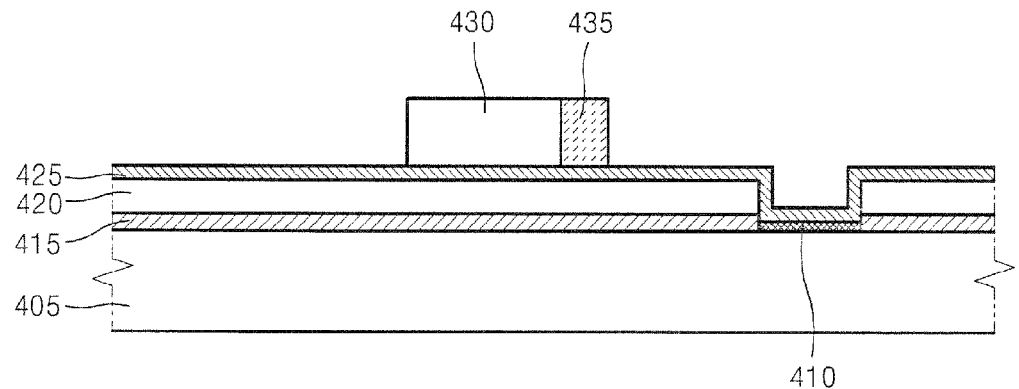

Referring to FIG. 7D, the crack buffer 435 including a polymer is formed beside the sacrificial layer 430 on the exposed first metal layer 425 using the photoresist pattern.

Figure 7E:
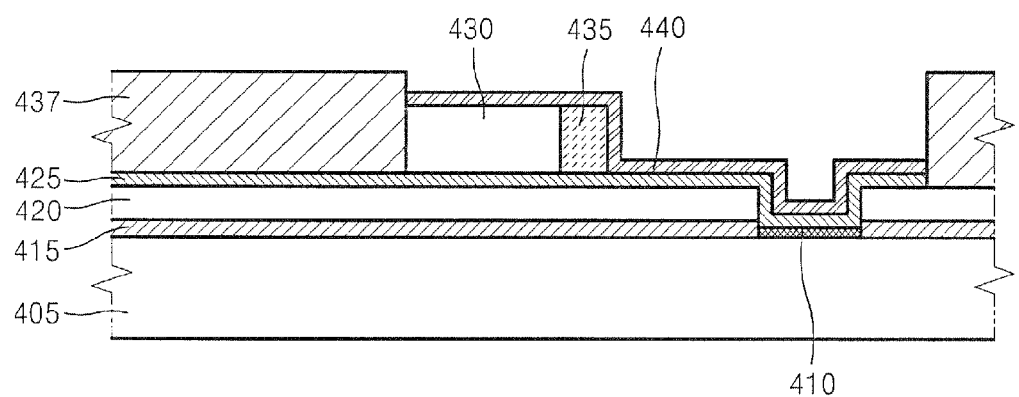

Referring to FIG. 7E, to define the redistribution line that is the second metal layer 440 on the first metal layer 425, the photoresist pattern 437 is formed on the first metal layer 425. The second metal layer 440 is selectively formed on the exposed first metal layer 425, the sacrificial layer 430, and the crack buffer 435. The second metal layer 440 can be formed in a plating process.

Figure 7F:
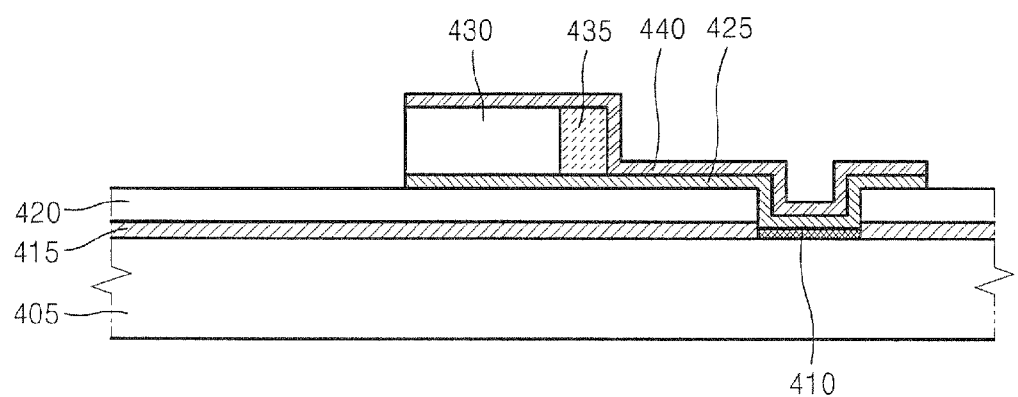

Referring to FIG. 7F, after the photoresist pattern 437 is removed, the first metal layer 425 is etched in an etching process using the second metal layer 440 and the sacrificial layer 430 as a mask. As a result, the redistribution line or redistribution pattern including the first and second metal layers 425 and 440 is formed.

When the crack buffer 435 according to another embodiment of the present invention is an air gap, the crack buffer 435 is manufactured by supplying a solution, for example, a developing solution, which can remove the polymer forming the crack buffer 435, to the crack buffer 435 through an opening existing between the redistribution line formed of the first and second metal layers 425 and 440. As a result, the polymer is removed and the crack buffer 435 can be formed as an air gap.

Figure 7G:
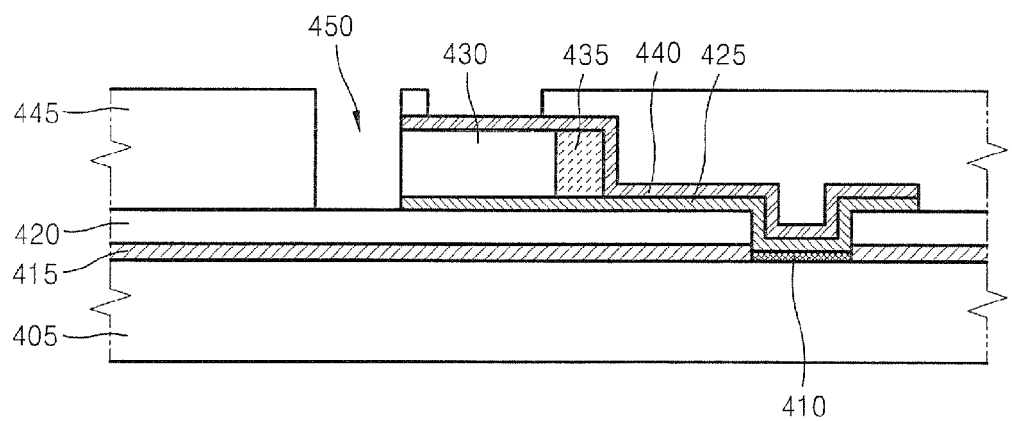

Referring to FIG. 7G, the second insulating layer 445 is formed on the second metal layer 440 and the first insulating layer 420. Then, the second insulating layer 445 is partially etched such that the crack inducement hole 450 is formed beside a portion formed of the first metal layer 425, the sacrificial layer 430, and the second metal layer 440. Also, the second insulating layer 445 is partially removed such that the redistribution pad of the redistribution line located on the sacrificial layer 430 is open.

Figure 7H:
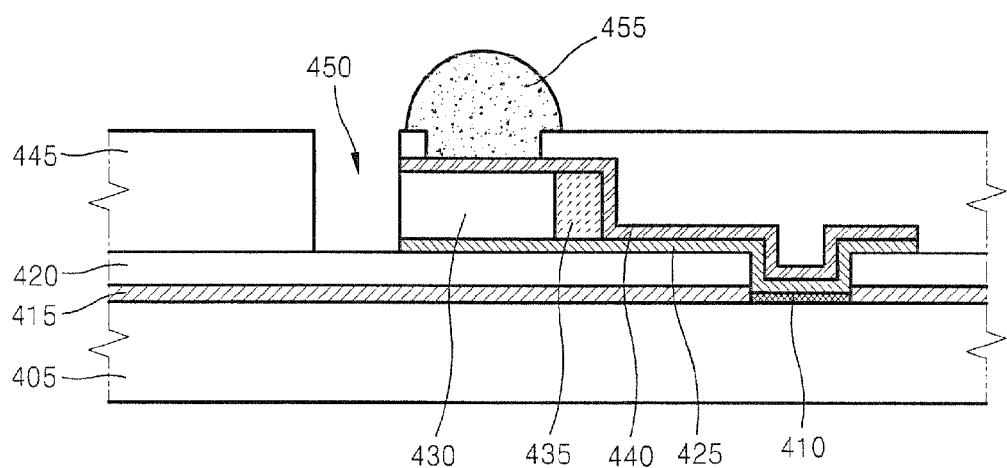

Referring to FIG. 7H, the solder ball 455 is attached to the redistribution pad in the solder ball attachment process, thereby completing the wafer level chip scale package 400 of FIG. 5.

According to an aspect of the present invention, a wafer level chip scale package comprises a semiconductor chip including a bonding pad, a first insulating layer disposed on the semiconductor chip and defining an opening exposing the bonding pad, a redistribution line disposed on the exposed bonding pad and the first insulating layer, a sacrificial layer disposed below a redistribution pad of the redistribution line, a second insulating layer disposed on the redistribution line, the second insulating layer defining an opening exposing the redistribution pad and including a crack inducement hole disposed beside the sacrificial layer, and an external connection terminal attached to the redistribution pad.

The sacrificial layer may comprise solder and the crack inducement hole may have a polygonal shape substantially surrounding a partial surface of the external connection terminal.

According to another aspect of the present invention, a wafer level chip scale package comprises a semiconductor chip including a bonding pad, a first insulating layer disposed on the semiconductor chip so as to expose the bonding pad, a first conductive layer disposed on the exposed bonding pad and the first insulating layer, a second conductive layer disposed on the first metal layer, a sacrificial layer disposed between the first metal layer and the second metal layer, which form a redistribution line, and below a redistribution pad that is a part of the second conductive layer, a second insulating layer disposed on the second conductive layer so as to expose the redistribution pad and including a crack inducement hole disposed beside the sacrificial layer, and an external connection terminal attached to the redistribution pad.

The external connection terminal may be a solder ball. The wafer level chip scale package may further comprise a passivation layer disposed between the first insulating layer and the semiconductor chip so as to expose the bonding pad.

According to another aspect of the present invention, a wafer level chip scale package comprises a semiconductor chip including a bonding pad, a first insulating layer disposed on the semiconductor chip so as to expose the bonding pad, a redistribution line disposed on the exposed bonding pad and the first insulating layer, a sacrificial layer disposed below a redistribution pad of the redistribution line, a crack buffer disposed between the sacrificial layer and the redistribution line, a second insulating layer disposed on the redistribution line so as to expose the redistribution pad and including a crack inducement hole disposed beside the sacrificial layer, and an external connection terminal attached to the redistribution pad.

The crack buffer may comprise a polymer or an air gap.

According to another aspect of the present invention, a wafer level chip scale package comprises a semiconductor chip including a bonding pad, a first insulating layer disposed on the semiconductor chip so as to expose the bonding pad a first conductive layer formed on the exposed bonding pad and the first insulating layer, a second conductive layer disposed on the first conductive layer, a sacrificial layer disposed between the first conductive layer and the second conductive layer which form a redistribution line, and below a redistribution pad that is a part of the second conductive layer, a crack buffer disposed between the sacrificial layer and the redistribution line, a second insulating layer formed on the second conductive layer so as to expose the redistribution pad and including a crack inducement hole disposed beside the sacrificial layer, and an external connection terminal attached to the redistribution pad.

According to another aspect of the present invention, a method of manufacturing a wafer level chip scale package comprises forming a first insulating layer on a semiconductor chip including a bonding pad so as to expose the bonding pad, forming a first conductive layer on the exposed bonding pad and the first insulating layer, forming a sacrificial layer on the first conductive layer using a photoresist pattern, forming a second conductive layer on the first conductive layer and the sacrificial layer using the photoresist pattern, forming a redistribution line by removing the first conductive layer using the second conductive layer and the sacrificial layer as a mask, forming a second insulating layer on the redistribution line, partially removing the second insulating layer to form a crack inducement hole beside the sacrificial layer and to expose a redistribution pad of the redistribution line located on the sacrificial layer, and attaching an external connection terminal to the redistribution pad.

The sacrificial layer may comprise solder. The crack inducement hole may have a polygonal shape substantially surrounding a partial surface of the external connection terminal. The method may further comprise forming a passivation layer between the first insulating layer and the semiconductor chip so as to expose the bonding pad.

According to another aspect of the present invention, a method of manufacturing a wafer level chip scale package comprises forming a first insulating layer on a semiconductor chip including a bonding pad so as to expose the bonding pad, forming a first conductive layer on the exposed bonding pad and the first insulating layer, forming a sacrificial layer on the first conductive layer using a photoresist pattern, forming a crack buffer beside the sacrificial layer using the photoresist pattern, forming a second conductive layer on the first conductive layer, the sacrificial layer, and the crack buffer using the photoresist pattern, forming a redistribution line by removing the first conductive layer using the second conductive layer and the sacrificial layer as a mask, forming a second insulating layer on the redistribution line, removing the second insulating layer to form a crack inducement hole beside the sacrificial layer and to expose a redistribution pad of the redistribution line on the sacrificial layer, and attaching an external connection terminal to the redistribution pad.

The method may further comprise forming the crack buffer as an air gap by supplying a solution which can remove the polymer to the polymer through an opening between the redistribution line formed of the first and second conductive layers.

According to another aspect of the present invention, a semiconductor chip module comprises a wafer level chip scale package and a module substrate connected via an external connection terminal to the wafer level chip scale package, wherein the wafer level chip scale package comprises a semiconductor chip including a bonding pad, a first insulating layer disposed on the semiconductor chip so as to expose the bonding pad, a redistribution line disposed on the exposed bonding pad and the first insulating layer, a sacrificial layer disposed below a redistribution pad of the redistribution line, a second insulating layer disposed on the redistribution line so as to expose the redistribution pad and including a crack inducement hole disposed beside the sacrificial layer, and an external connection terminal attached to the redistribution pad.

The sacrificial layer may comprise solder. The crack inducement hole may have a polygonal shape substantially surrounding a partial surface of the external connection terminal.

According to another aspect of the present invention, a semiconductor chip module comprises a wafer level chip scale package and a module substrate connected via an external connection terminal to the wafer level chip scale package, wherein the wafer level chip scale package comprises a semiconductor chip including a bonding pad, a first insulating layer disposed on the semiconductor chip so as to expose the bonding pad, a redistribution line disposed on the exposed bonding pad and the first insulating layer, a sacrificial layer disposed below a redistribution pad of the redistribution line, a crack buffer disposed between the sacrificial layer and the redistribution line, a second insulating layer disposed on the redistribution line so as to expose the redistribution pad and including a crack inducement hole disposed beside the sacrificial layer, and an external connection terminal attached to the redistribution pad.

The sacrificial layer may comprise solder. The crack inducement hold may have a polygonal shape substantially surrounding a partial surface of the external connection terminal. The crack buffer may be a polymer or an air gap.

As described above, when the wafer level chip scale package according to the present invention is mounted on a module substrate to form a semiconductor chip module, since the wafer level chip scale package can induce a crack in the sacrificial layer which otherwise may have been generated in the solder joint, the wafer level chip scale package can skip the underfill process. Also, since the generation of a crack in the solder joint can be prevented, the reliability of mounting of the semiconductor chip module can be improved.

While the present invention has been particularly shown and described with reference to preferred embodiments thereof, it will be understood by those skilled in the art that various changes in form and details may be made therein without departing from the spirit and scope of the invention as defined by the appended claims.

What is claimed is:

1. A wafer level chip scale package comprising:
   a semiconductor chip including a bonding pad;
   a first insulating layer disposed on the semiconductor chip and defining an opening exposing the bonding pad;
   a redistribution line disposed on the exposed bonding pad and on the first insulating layer, the redistribution line having a redistribution pad defined thereon;
   a sacrificial layer exposing the sacrificial layer at the side surface disposed below the redistribution pad and including a side surface;
   a second insulating layer disposed on the redistribution line, the second insulating layer defining another opening exposing the redistribution pad and including a crack inducement hole disposed beside the sacrificial layer; and
   an external connection terminal attached to the redistribution pad.

2. The wafer level chip scale package of claim 1, wherein the sacrificial layer comprises solder.

3. The wafer level chip scale package of claim 1, wherein the crack inducement hole has a polygonal shape substantially surrounding a partial surface of the external connection terminal.

4. The wafer level chip scale package of claim 1, wherein the redistribution line comprises:
   a first conductive layer disposed on the exposed bonding pad and the first insulating layer;
   a second conductive layer disposed on the first conductive layer,
   wherein the sacrificial layer is disposed between the first conductive layer and the second conductive layer, and below the redistribution pad that is a part of the second conductive layer.

5. The wafer level chip scale package of claim 4, further comprising a passivation layer disposed between the first insulating layer and the semiconductor chip and exposing the bonding pad.

6. The wafer level chip scale package of claim 4, further comprising a crack buffer disposed between the sacrificial layer and the redistribution line.

7. The wafer level chip scale package of claim 6, wherein the crack buffer comprises a polymer.

8. The wafer level chip scale package of claim 6, wherein the crack buffer is an air gap.

9. The wafer level chip scale package of claim 1, further comprising a crack buffer disposed between the sacrificial layer and the redistribution line.

10. The wafer level chip scale package of claim 9, wherein the crack buffer comprises one or more of a polymer and an air gap.

11. The wafer level chip scale package of claim 9, further comprising a passivation layer formed between the first insulating layer and the semiconductor chip so as to expose the bonding pad.

12. A semiconductor chip module comprising:
a wafer level chip scale package; and
a module substrate connected via an external connection terminal to the wafer level chip scale package,
wherein the wafer level chip scale package comprises:
  a semiconductor chip including a bonding pad;
  a first insulating layer disposed on the semiconductor chip so as to expose the bonding pad;
  a redistribution line disposed on the exposed bonding pad and the first insulating layer;
  a sacrificial layer disposed below a redistribution pad of the redistribution line and including a side surface;
  a second insulating layer disposed on the redistribution line so as to expose the redistribution pad and including a crack inducement hole disposed beside the sacrificial layer exposing the sacrificial layer at the side surface; and
  the external connection terminal attached to the redistribution pad.

13. The semiconductor chip module of claim 12, wherein the wafer level chip scale package further comprises a crack buffer disposed between the sacrificial layer and the redistribution line.

* * * * *